US009679879B2

(12) United States Patent
Zhu

(10) Patent No.: US 9,679,879 B2
(45) Date of Patent: Jun. 13, 2017

(54) LED LIGHT-EMITTING DEVICE

(71) Applicants: Zhejiang Zhongzhou Lighting Technology Co., Ltd., Hangzhou (CN); Qunliang Zheng, Hangzhou (CN)

(72) Inventor: Xiaobiao Zhu, Hangzhou (CN)

(73) Assignees: Zhejiang Zhongzhou Lighting Technology Co., Ltd., Zhejiang (CN); Qunliang Zheng, Zhejiang (CN)

( * ) Notice: Subject to any disclaimer, the term of this patent is extended or adjusted under 35 U.S.C. 154(b) by 0 days.

(21) Appl. No.: 14/762,602

(22) PCT Filed: Jan. 22, 2014

(86) PCT No.: PCT/CN2014/071154
§ 371 (c)(1),
(2) Date: Jul. 22, 2015

(87) PCT Pub. No.: WO2014/114242
PCT Pub. Date: Jul. 31, 2014

(65) Prior Publication Data
US 2015/0364452 A1   Dec. 17, 2015

(30) Foreign Application Priority Data
Jan. 22, 2013  (CN) .......................... 2013 1 0024997

(51) Int. Cl.
*H01L 25/075* (2006.01)
*H01L 33/54* (2010.01)
(Continued)

(52) U.S. Cl.
CPC .......... *H01L 25/0753* (2013.01); *H01L 24/83* (2013.01); *H01L 25/075* (2013.01);
(Continued)

(58) Field of Classification Search
CPC .................................................. H01L 25/0753
(Continued)

(56) References Cited

U.S. PATENT DOCUMENTS 5,445,608 A * 8/1995 Chen .................... A61N 5/0601
604/19
2006/0163589 A1 * 7/2006 Fan ....................... H01L 27/153
257/88

(Continued)

FOREIGN PATENT DOCUMENTS

CN  202259395 U   5/2012
CN  202493931 U   10/2012
EP  2535640 A1   12/2012

*Primary Examiner* — Eugene Lee
(74) *Attorney, Agent, or Firm* — The Webb Law Firm

(57) ABSTRACT

Provided is a LED light-emitting device including: a carrier, which is a transparent body, and on a carrying surface of which conductors are provided; a plurality of LED chips, which are electrically connected to the conductors by way of eutectic bonding, so as to realize electrical connection among the plurality of LED chips; an encapsulation structural member, which is a transparent body and encapsulates on the periphery of the carrier and the LED chips; and a pair of electrodes, wherein positive electrode/negative electrodes in the pair of electrodes are electrically connected to the LED chips located at the most upstream/most downstream of a current transmission in the plurality of LED chips by means of the conductors, and extend to the outside of the encapsulation structural member.

6 Claims, 9 Drawing Sheets

(51) Int. Cl.
*H01L 33/62* (2010.01)
*H01L 23/00* (2006.01)
*H01L 33/64* (2010.01)

(52) U.S. Cl.
CPC .............. *H01L 33/54* (2013.01); *H01L 33/62* (2013.01); *H01L 33/641* (2013.01); *H01L 24/97* (2013.01); *H01L 2224/83805* (2013.01); *H01L 2924/01322* (2013.01); *H01L 2924/12041* (2013.01)

(58) Field of Classification Search
USPC .......................................................... 257/95
See application file for complete search history.

(56) References Cited

U.S. PATENT DOCUMENTS

2012/0299022 A1\* 11/2012 Hussell ............... H01L 25/0753
257/88
2013/0058080 A1 3/2013 Ge et al.

\* cited by examiner

LED LIGHT-EMITTING DEVICE

CROSS-REFERENCE TO RELATED APPLICATIONS

This application is the United States national phase of International Application No. PCT/CN2014/071154 filed Jan. 22, 2014, and claims priority to Chinese Patent Application No. 201310024997.X filed Jan. 22, 2013, the disclosures of which are hereby incorporated in their entirety by reference.

FIELD OF THE INVENTION

The present invention relates to LED light-emitting technology, and particularly relates to a LED light-emitting device.

BACKGROUND OF THE INVENTION

LED (Light Emitting Diode) has been applied to many fields due to its advantages of energy conservation, environmental protection, light weight, long service life, small volume, stable performance and the like. Especially in the field of illumination, LED has been more and more widely used, and is regarded as one of main light sources in illumination in future.

Generally, encapsulating a LED light-emitting device in the prior art comprises steps of: injecting polyphthalamide (PPA) or engineering plastic on a metal support or metal substrate, so as to form an optical cup; fixing one or a plurality of LED chips within the optical cup, and connecting the plurality of LED chips in serial/parallel through metal wires; and filling the optical cup with a gel mixed with a fluorescent powder. The luminous efficiency of the LED light-emitting device encapsulated in such manner is relatively low, because the metal support or metal substrate that is light-proof itself makes light emitted from the LED chips cannot transmit through the support or substrate and be output to the outside. Additionally, the light that is not output will generate a large amount of heat inside the optical cup, and no separated heat conduction path is provided for the LED chips, so that the heat generated by the LED chips will be excessively aggregated, resulting in that the reliability of the LED light-emitting device will be decreased in a manner of linear regularity. In fact, light output of the prior LED light-emitting device only accounts for 20% - 30% of its produced energy, and the other 70% - 80% of energy is not being utilized but generates heat. Therefore, how to improve the luminous efficiency of the LED light-emitting device, enhance its application function and prolong its service life become urgent issues to be solved.

SUMMARY OF THE INVENTION

To solve the above problems, the present invention provides a LED light-emitting device, which can not only improves luminous efficiency of the LED light-emitting device, but can also reduce generation of heat, thus having characteristics of high luminous efficiency, high reliability and long service life, etc.

For this purpose, the present invention provides a LED light-emitting device, including: a carrier, which is a transparent body, and on a carrying surface of which conductors are arranged; a plurality of LED chips, which are electrically connected to the conductors by way of eutectic bonding, so as to realize electrical connection among the plurality of LED chips; an encapsulation structural member, which is a transparent body and encapsulates on the periphery of the carrier and the plurality of LED chips; and a pair of electrodes, wherein positive/negative electrodes of the pair of electrodes are electrically connected to the LED chips located at the most upstream/most downstream of a current transmission in the plurality of LED chips by means of the conductors, and extend to the outside of the encapsulation structural member.

The number of the LED chips is N, the number of the conductors is N+1, where N is an integer larger than 1, and the N LED chips and the N+1 conductors are alternately arranged along an extension direction of the pair of electrodes; chip soldering pads are provided at both ends of the bonding surface of each LED chip, circuit soldering pads are correspondingly provided at two ends of two conductors adjacent to the LED chip, and shape of the chip soldering pads corresponds to that of the circuit soldering pads; each LED chip and two conductors adjacent thereto are electrically connected by soldering the chip soldering pads with the circuit soldering pads by way of eutectic bonding.

The encapsulation structural member encapsulates the carrying surface of the carrier, the LED chips fixed on the carrying surface, a surface of the carrier far away from the carrying surface, and marginal areas of both side surfaces of the carrier.

Preferably, two protrusions extending to each other are formed on two successively spaced conductors, and the two protrusions are located at both sides of the LED chip between the two successively spaced conductors.

In a section vertical to the extension direction of the pair of electrodes, the encapsulation structural member encapsulates, with an encapsulating angle of 180° radius angle and in circumferential direction, the carrying surface of the carrier, the LED chips fixed on the carrying surface, and the surface of the carrier far away from the carrying surface, respectively.

The pair of electrodes is a pair of metal electrode plates, each of the metal electrode plates includes an assembling part and a connecting part, which are integrally connected to each other, wherein the assembling parts are bonded to both ends of the carrying surface of the carrier by means of conductive adhesive, and the adhesive is electrically connected to the corresponding conductor by way of eutectic bonding, reflow soldering or high temperature solidification; ends of the connecting parts of the pair of metal electrode plates, which are far away from the assembling parts, have different shapes.

Preferably, limit grooves are formed at both ends of the carrier and positioned on the carrying surface thereof, the assembling parts are fixed into the limit grooves by means of the adhesive, and the adhesive encapsulates outer surfaces of the assembling parts inside the limit grooves; or limit grooves are provided at ends of the assembling parts far away from the connecting parts, both ends of the carrier are fixed into the limit grooves by means of the adhesive, and the adhesive encapsulates outer surfaces of the carrier inside the limit grooves.

Preferably, the width of the assembling part is larger than that of the connecting part.

A heat dissipation layer that is transparent and heat-conductive is provided between the carrying surface of the carrier and the bonding surfaces of the LED chips for exchanging heat with the LED chips, and material of the heat dissipation layer includes one or more of silica gel, epoxy glue, silicon resin and modified resin.

The conductor is made of a conductive metal material.

Compared to the prior art, the beneficial effects of the present invention are as below.

In the LED light-emitting device provided by the present invention, light emitted from the LED chips can transmit through the transparent carrier and encapsulation structural member and then be output to the outside of the LED light-emitting device, and therefore, the LED device can realize multi-dimensional light emission. It not only can improve the luminous efficiency of the LED light-emitting device, but also can minimizes the defects such as generation of large amount of heat due to less light output as described in the BACKGROUND OF THE INVENTION, thereby improving the reliability of the LED light-emitting device and prolonging its service life.

In addition, the plurality of the LED chips can be electrically connected to the conductors provided on the carrier by way of eutectic bonding instead of wires, so as to realize the electrical connection among the plurality of the LED chips. It not only can reduce manufacturing cost of the LED light-emitting device, but also can omit the relatively complicated wire connecting process among the plurality of the LED chips, thereby simplifying the manufacturing process of the LED light-emitting device.

DETAILED DESCRIPTION OF THE EMBODIMENTS

Figure 1A:
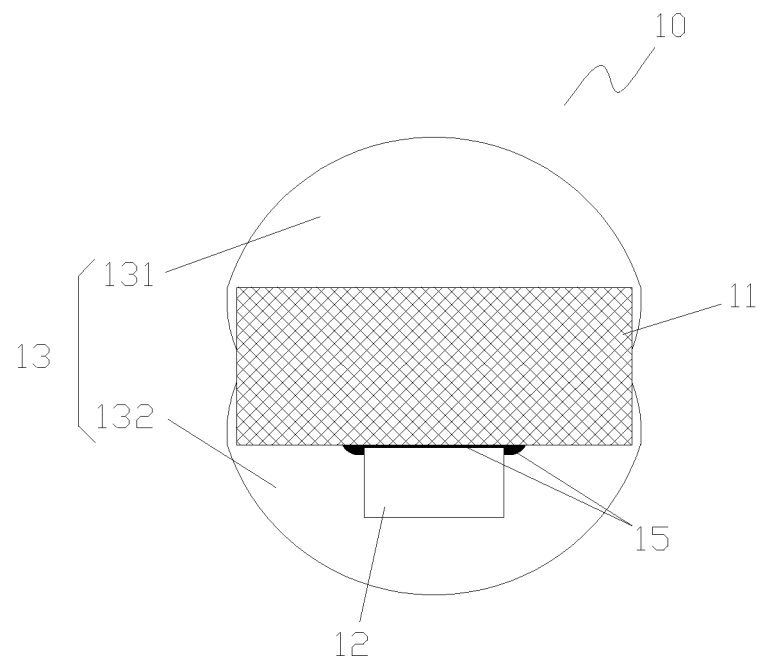
FIG. 1A is a front view of a LED light-emitting device provided by a first embodiment of the present invention.

To make those skilled in the art better understand the technical solutions of the present invention, preferred embodiments used for implementing the present invention will be further described in detail below in conjunction with the accompany drawings. However, the following illustrated embodiments are used for embodying technical concepts of the LED light-emitting devices provided by the present invention, rather than limiting the technical concepts of the present invention. Further, sizes and positional relationships of the parts shown in the drawings are exaggerated for clarity of explanation only, rather than defining the actual sizes and positional relationships of these parts.

The present invention provides a LED light-emitting device, including the following components: a transparent carrier; a plurality of LED chips; an encapsulation structural member, which is transparent and encapsulates on the periphery of the carrier and the LED chips; and a pair of electrodes. Conductors are provided on the carrying surface of the carrier, and the plurality of LED chips are electrically connected to the conductors by way of eutectic bonding and fixed on the carrying surface of the carrier by means of the conductors. The so-called carrying surface of the carrier refers to a surface of the carrier used for disposing the LED chips thereon. Preferably, the surface of the carrier is treated by roughening, so as to form a roughened reflecting layer with a concave-convex structure. The carrier having the roughened reflecting layer with the concave-convex structure is, viewed from outside, semi-transparent.

In the LED light-emitting device provided by the present invention, the plurality of LED chips can be electrically connected to the conductors provided on the carrier by way of eutectic bonding instead of wires, so as to realize the electrical connection among the plurality of the LED chips. It not only can reduce the manufacturing cost of the LED light-emitting device, but also can omit the relatively complicated wire connecting process among the plurality of the LED chips, thereby simplifying the manufacturing process of the LED light-emitting device.

In the plurality of LED chips as described above, the LED chip located at the most upstream of a current transmission is connected to the positive electrode of the pair of electrodes, and the LED chip located at the most downstream of the current transmission is connected to the negative electrode of the pair of electrodes. The LED chip located at the most upstream of a current transmission refers to the LED chip through which current firstly flows among these LED chips, and the LED chip located at the most downstream of the current transmission refers to the LED chip through which the current lastly flows among these LED chips. In fact, the LED chips located at the most upstream/most downstream may not correspond to the physical positions thereof, i.e., among these LED chips, the LED chips physically located at both ends are not necessarily located at the most upstream/most downstream of the current transmission. Among the plurality of LED chips, the LED chips located at the most upstream/most downstream of the current transmission are the two LED chips located at both ends only when the LED chips are electrically connected in turn, according to their setting positions, by means of the conductors. Further, the conductor may be made of a conductive metal material such as gold, silver or copper. The shape and the arrangement manner of the conductors on the carrier are not limited, as long as the conductors can realize the electrical connection among the plurality of the LED chips and the electrical connections between the LED chips located at the most upstream and most downstream of the current transmission and the positive and negative electrodes of the pair of electrodes, respectively.

In the LED light-emitting device provided by the present invention, light emitted from the LED chips can transmit through the transparent carrier and encapsulation structural member and then be output to the outside of the LED light-emitting device, such that the LED device can realize a multi-dimensional light emission. It not only can improve the luminous efficiency of the LED light-emitting device (in fact, the luminous efficiency of the LED light-emitting device provided by the present invention is 30%-50% higher than that of the prior LED light-emitting device), but also can minimizes the defects such as generation of large amount of heat due to less light output as described in the BACKGROUND OF THE INVENTION, thereby improving the reliability of the LED light-emitting device and prolonging its service life.

First Embodiment

Figure 1B:
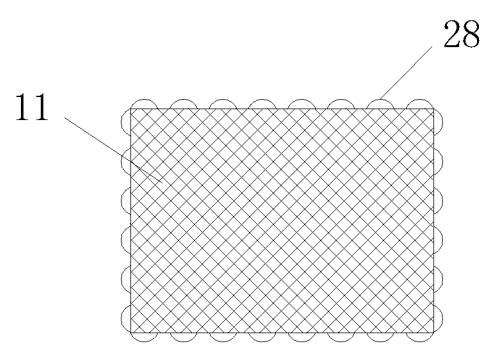
FIG. 1B is a section view of a carrier in the LED light-emitting device shown in FIG. 1A.
Figure 1C:
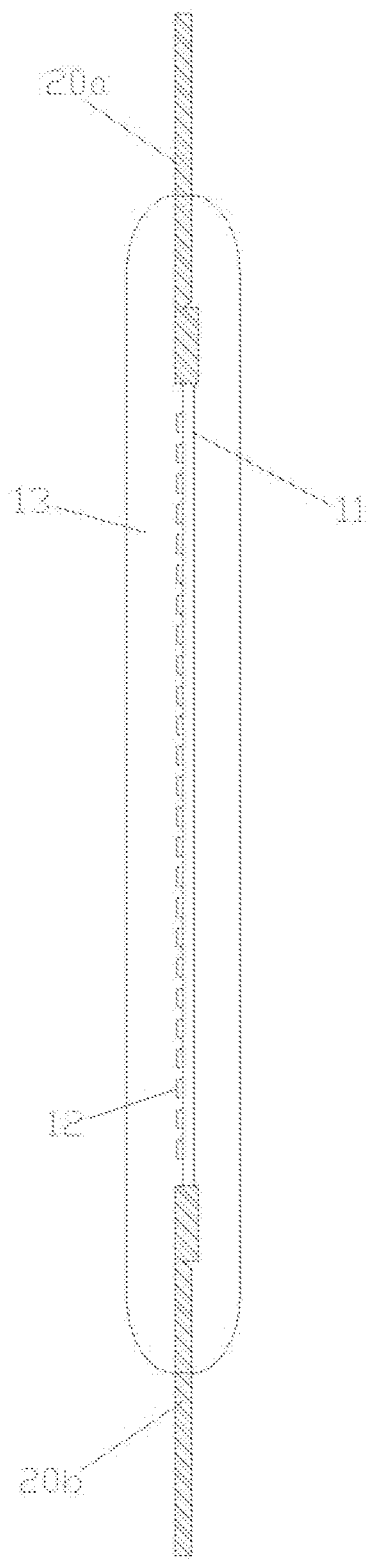
FIG. 1C is a side view of the LED light-emitting device provided by the first embodiment of the present invention.

Referring to FIGS. 1A-1J, the structure of a LED light-emitting device provided by the first embodiment of the present invention is shown. The LED light-emitting device 10 in this embodiment includes a carrier 11, a plurality of LED chips 12, an encapsulation structural member 13 and a pair of metal electrode plates (20a, 20b). The carrier 11 is a transparent body and may be made of one of glass, ceramic, plastic and the like, or a combination of two or more thereof. Further, the surface of the carrier 11 is treated by roughening, so as to form a roughened reflecting layer 28 with a concave-convex structure, such that the carrier 11 is, viewed from outside, a semi-transparent body, as shown in FIG. 1B. Moreover, in the longitudinal section of the roughened reflecting layer 28 (i.e., the section along a direction vertical to the plane of paper), the shape of protrusions of the concave-convex structure may be semi-circle, ellipse, zig-zag, triangle or the like. By means of the roughened reflecting layer 28 with the concave-convex structure, light emitted from the LED chips 12 can be reflected, and light beams can be coupled with each other, so that the light output from the LED light-emitting device 10 can be even and gentle. In practical applications, according to the luminous structures of different LED chips 12, the outer surface of the carrier 11 can be roughened to different extents, so as to have different shapes of the concave-convex structure, depths of recesses, heights of protrusions and the like. In practical applications, four side surfaces of the carrier 11, i.e., four surfaces vertical to the plane of paper in FIG. 1B, may be roughened to different extents. Alternatively, only the carrying surface and the surface opposite to the carrying surface of the carrier 11 may be roughened to different extents. Alternatively, only two of the four side surfaces of the carrier 11 other than the carrying surface and the surface opposite to the carrying surface may be roughened to different extents.

Figure 1D:
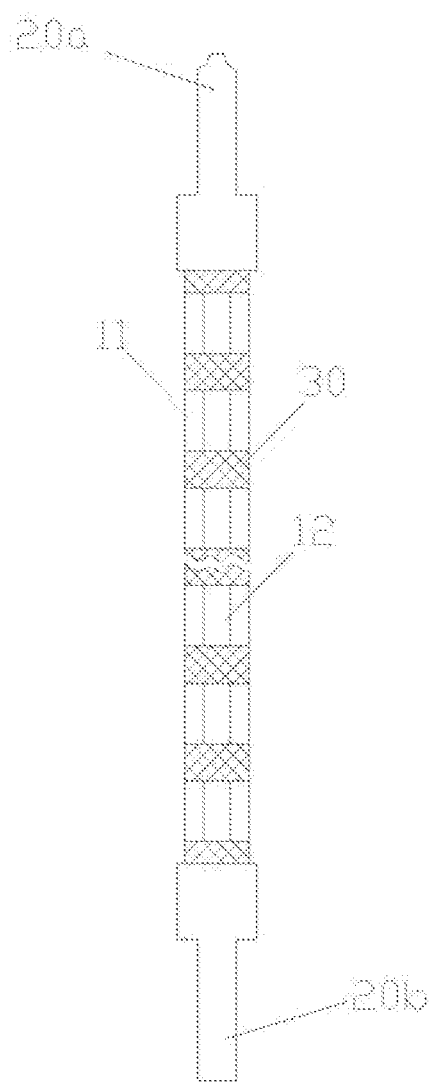
FIG. 1D is a top view of the LED light-emitting device provided by the first embodiment of the present invention.
Figure 1E:
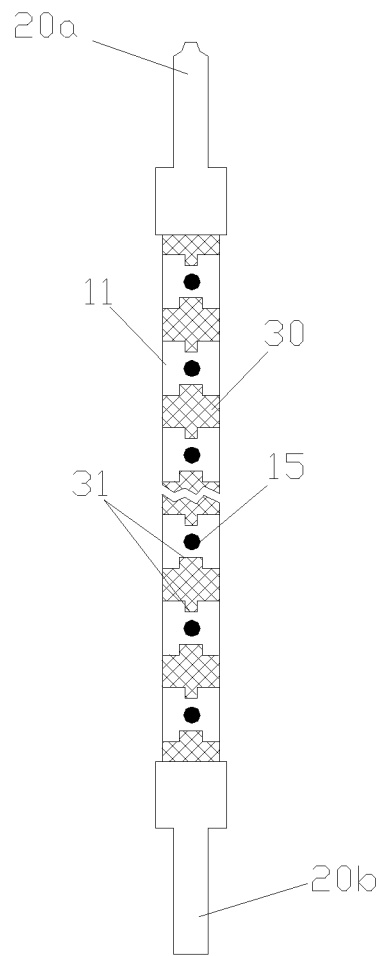
FIG. 1E is a top view of the LED light-emitting device shown in FIG. 1D, before assembled with LED chips.
Figure 1F:
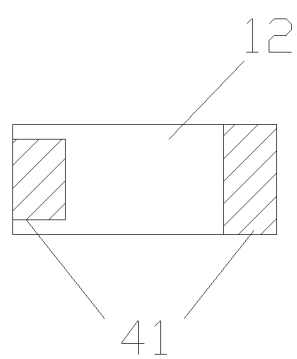
FIG. 1F is a schematic diagram of a bonding surface of the LED chip of the LED light-emitting device shown in FIG. 1D.
Figure 1G:
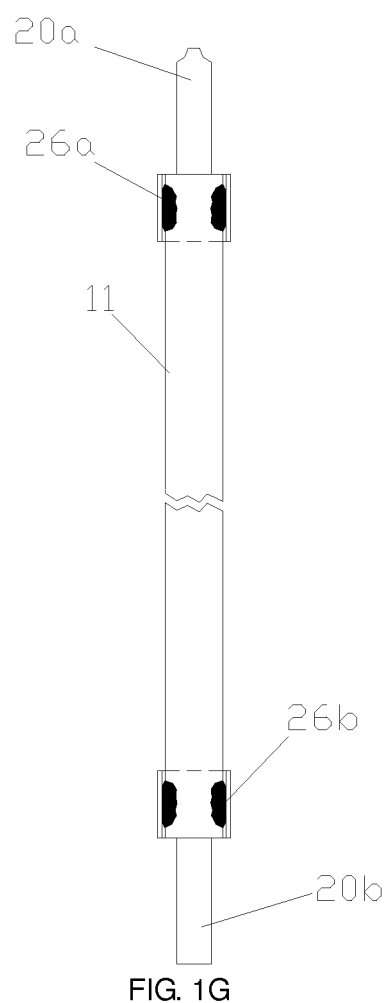
FIG. 1G is a top view showing a connection relationship between a pair of electrodes and the carrier of the LED light-emitting device shown in FIG. 1D.
Figure 1H:
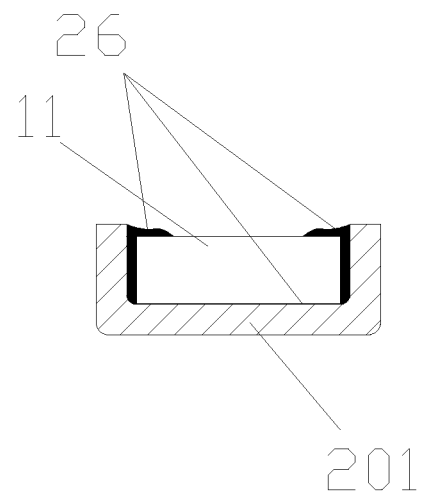
FIG. 1H is a front section view showing a connection relationship between the pair of electrodes and the carrier of the LED light-emitting device shown in FIG. 1D.
Figure 1I:
FIG. 1I is a schematic diagram showing the structure of the pair of electrodes of the LED light-emitting device shown in FIG. 1D.

In this embodiment, the number of the LED chips 12 is N, N+1 conductors 30 are provided on the carrying surface of the carrier 11, where N is an integer larger than 1, and the N LED chips 12 and the N+1 conductors 30 are alternately arranged along the extension direction of the metal electrode plates (20a, 20b), i.e., one LED chip 12 is arranged between every two successively spaced conductors 30, as shown in FIG. 1D. Further, chip soldering pads 41 are provided at both ends of each LED chip 12 and located on the bonding surface thereof, as shown in FIG. 1F. Correspondingly, circuit soldering pads 31 are provided at the two ends of two conductors 30 adjacent to the LED chip 12, as shown in FIG. 1E, and the shape of the chip soldering pads 41 correspond to that of the circuit soldering pads 31. The bonding surface of the LED chip 12 refers to a surface of the LED chip 12 used for bonding with the carrying surface of the carrier 11. Each of the LED chips 12 and the two conductors 30 adjacent thereto are electrically connected by soldering the chip soldering pads 41 with the circuit soldering pads 31 by way of eutectic bonding, so that the N LED chips 12 are electrically connected, e.g., in serial, in parallel, or combination thereof.

Moreover, as the LED chips 12 is fixed on the carrier 11 by soldering the chips soldering pads 41 and the circuit soldering pads 31 together, i.e., supporting points for supporting the LED chips 12 on the carrier 11 are located on the conductors 30, resulting in gaps existing between the bonding surfaces of the LED chips 12 and the carrying surface of the carrier 11. In other words, LED chips 12 are suspended above the carrying surface of the carrier 11, adversely affecting heat dissipation of the LED chips 12. For this reason, a transparent and heat-conducting heat dissipation layer 15 is formed between the carrying surface of the carrier 11 and the bonding surface of the LED chip 12 for exchanging heat with the LED chip 12, so that the heat generated by the LED chip 12 is transmitted to the outside through the heat dissipation layer 15 and the carrier 11. Material of the heat dissipation layer 15 may include one or more of silica gel, epoxy glue, silicon resin and modified resin.

In practical applications, when the LED light-emitting device is a light-emitting device of an ordinary monochromatic light, the plurality of LED chips 12 are all corresponding LED chips 12 of the ordinary monochromatic light, e.g., the plurality of LED chips 12 are all chips of blue light or chips of any visible light other than blue light. When the LED light-emitting device is a light-emitting device with high luminous efficiency and high colour rendering index, the plurality of LED chips 12 include LED chips. of blue light and LED chips of red (or yellow) light, and one LED chip 12 of red (or yellow) light is provided after every two successively spaced LED chips 12 of blue light, so as to realize sufficient light mixing by uniform distribution. Here, uniform distribution refers to an organized distribution, e.g., providing one LED chip of red (or yellow) light after two successively spaced LED chips of blue light; and the organized distribution is not limited to the above distribution and arrangement manner, but can be adjusted and configured according to actual needs.

In this embodiment, the pair of metal electrode plates (20a, 20b) are used as positive/negative electrodes of the LED light-emitting device 10, and provided at both ends of the carrier 11 and at a distance of at least 0.5 mm away from the LED chips 12 provided at both ends of the carrier 11. Specifically, the metal electrode plates (20a, 20b) include assembling parts 201 and connecting parts (202a, 202b), which are integrally connected to each other. The ends of the assembling parts 201 far away from the connecting parts (202a, 202b) are provided with limit grooves, and both ends of the carrier 11 are fixed into the limit grooves of the assembling parts 201 by means of conductive adhesive (26a, 26b), which are electrically connected to the corresponding conductors 30 (i.e., the conductors 30 provided at both ends of the carrier 11) by way of eutectic bonding, reflow soldering or high temperature solidification. The adhesive (26a, 26b) may be made of a conductive material such as tin paste or a material with high thermal conductivity and high adhesive force like silver sol. With the limit grooves of the assembling parts 201, it not only can align and assemble the metal electrode plates (20a, 20b) more accurately and promptly, but also can encapsulate, with the adhesive 26, the outer surfaces of the carrier 11 that are located inside the limit grooves, i.e., four surfaces of the carrier 11 vertical to the plane of paper in FIG. 1H, so that the reliability of the connections between the metal electrode plates (20a, 20b) and the carrier 11 can be improved.

Moreover, to identify polarities of both ends of the LED light-emitting device 10, ends of the two connecting parts (202a, 202b) of the pair of metal electrode plates (20a, 20b), which are far away from the assembling parts 201, are designed to have different shapes, so as to serve as polarity identifiers of both ends of the LED light-emitting device 10, as shown in FIG. 11. In practical applications, the ends of the two connecting parts (202a, 202b) far away from the assembling parts 201 may arbitrarily have different shapes, which are not specifically limited herein. In addition, preferably, widths of the assembling parts 201 are larger than those of the connecting parts (202a, 202b), thereby facilitating the assembly of the metal electrode plates (20a, 20b).

It should be noted that, although the limit grooves in this embodiment are provided at the ends of the assembling parts 201 far away from the connecting parts (202a, 202b), the present invention is not limited thereto. In practical applications, the limit grooves may be provided at both ends of the carrier 11 and positioned on the carrying surface thereof, and in such a case, the ends of the assembling parts 201 far away from the connecting parts (202a, 202b) are fixed into the limit grooves by means of the above described adhesive, and the outer surfaces of the assembling parts 201 that are located inside the limit grooves are encapsulated with the adhesive. In this way, the metal electrode plates (20a, 20b) can also be aligned and assembled more accurately and promptly, and the reliability of the connections between the metal electrode plates (20a, 20b) and the carrier 11 can also be improved.

Moreover, in practical applications, instead of providing limit grooves at both ends of the carrying surface of the carrier 11 or at the ends of the assembling parts 201 far away from the connecting parts (202a, 202b), the metal electrode plates (20a, 20b) may be fixed onto the carrying surface of the carrier 11 by the conductive adhesive (26a, 26b), and electrically connected to the corresponding conductors by way of eutectic bonding, reflow soldering or high temperature solidification. Alternatively, limit structures such as square step or trapezoid step may be provided at both ends of the carrying surface of the carrier 11, so as to align the metal electrode plates (20a, 20b) more accurately and promptly.

In this embodiment, the encapsulation structural member 13 is a transparent body and made of a mixture of a transparent glue and a fluorescent powder, and encapsulates the carrying surface of the carrier 11, the LED chips 12 fixed thereon, the surface of the carrier 11 far away from the carrying surface, and the marginal areas of both side surfaces of the carrier 11, respectively. Specifically, the encapsulation structural member 13 consists of two portions, sections of which have a shape of approximate semi-circle. The first portion 131 is used for encapsulating the surface of the carrier 11 far away from the carrying surface and the marginal areas of both side surfaces of the carrier 11 (i.e., the upper surface and the upper areas of both side surfaces adjacent thereto of the carrier 11 in FIG. 1A); and the second portion 132 is used for encapsulating the carrying surface of the carrier 11, the LED chips 12 fixed thereon and the marginal areas of both side surfaces of the carrier 11 (i.e., the bottom surface and the lower areas of both side surfaces adjacent thereto of the carrier 11 in FIG. 1A). In practical applications, the shape of the section, in the direction vertical to the extension direction of the metal electrode plates (20a, 20b), of the encapsulation structural member 13 may be semi-circle, ellipse, square, or the like.

Figure 1J:
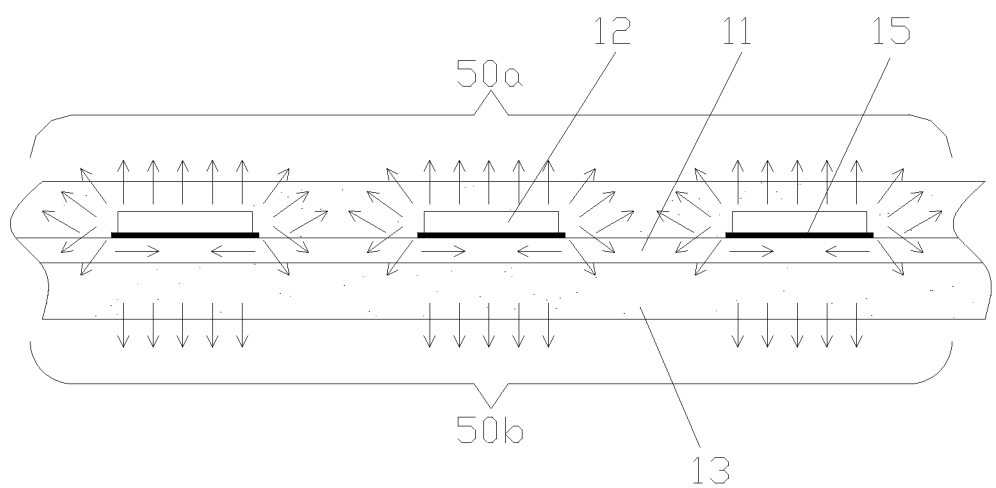
FIG. 1J is a light-path diagram of the LED light-emitting device provided by the first embodiment of the present invention.

As the encapsulation structural member 13 is made of the mixture of the transparent glue and the fluorescent powder, as shown in FIG. 1J, one part of the light 50b emitted from the LED chips 12 can transmit through the transparent heat dissipation layer 15, carrier 11 and encapsulation structural member 13 and then be output to the outside of the LED light-emitting device 10, while the other part of the light 50a emitted from the LED chips 12 can transmit through the transparent encapsulation structural member 13 and then be output to the outside of the LED light-emitting device 10, so as to realize multi-dimensional light emission; and in a case where the LED chips 12 are LED chips of blue light, one part of the light 50b emitted therefrom transmits through the heat dissipation layer 15, carrier 11 and encapsulation structural member 13, and excites the fluorescent powder within the encapsulation structural member 13, so as to output white light to the outside, while the other part of the light 50a emitted therefrom transmits through the encapsulation structural member 13 and excites the fluorescent powder within the encapsulation structural member 13, so as to output white light to the outside, so that homogeneous white light can be output to the outside.

Further, in the LED light-emitting device 10 provided by this embodiment, the marginal areas of both side surfaces of the carrier 11 are encapsulated by means of the encapsulation structural member 13 made of the mixture of the transparent glue and the fluorescent powder, so that color deviation occurring at the marginal areas of both side surfaces of the carrier 11, which is caused by that part of the light emitted from the LED chips 12 is directly output from the marginal areas, can be prevented, which can further ensure that the LED light-emitting device 10 can output homogeneous white light in all directions. Moreover, in the LED light-emitting device 10 provided by this embodiment, as the entire surface of the carrier is not fully encapsulated by means of the encapsulation structural member 13, and central areas of both side surfaces of the carrier 11 are exposed to outside of the encapsulation structural member 13, which facilitates heat dissipation of the LED chips 12, so that the LED chips 12 can be suitable for larger driving current. It not only can improve light output of individual LED chip 12, but also can reduce the manufacturing cost of the LED light-emitting device.

Figure 2A:
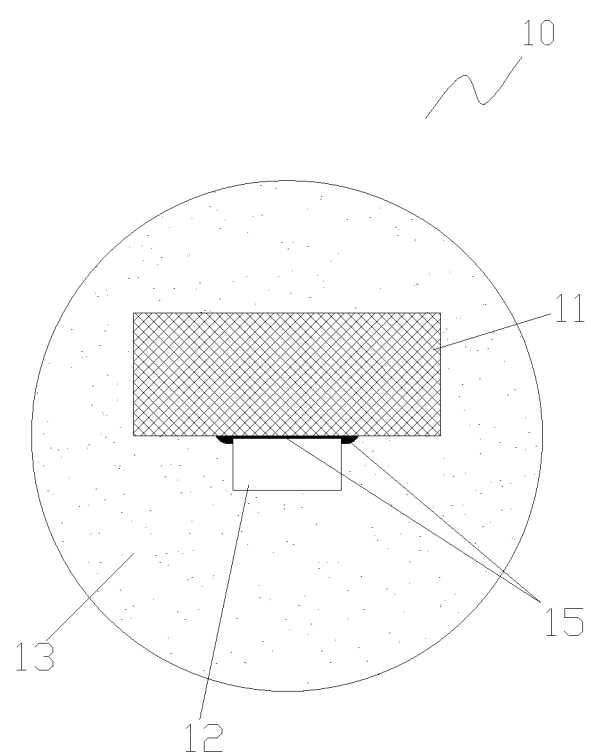
FIG. 2A is a front view of another encapsulation structural member of the LED light-emitting device provided by the first embodiment of the present invention.
Figure 2B:
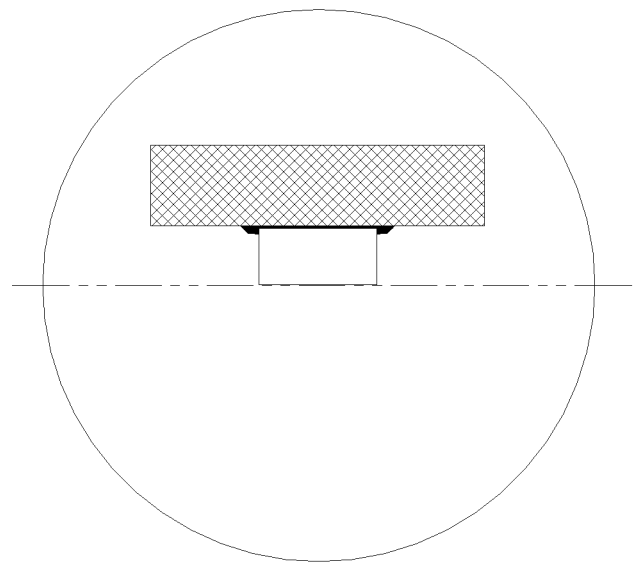
FIG. 2B is a schematic diagram showing the positional relationship among the carrier and the LED chip and the encapsulation structural member of the LED light-emitting device shown in FIG. 2A.

It should be noted that, in this embodiment, the encapsulation structural member 13 encapsulates the carrying surface of the carrier 11, the LED chips 12 fixed thereon, the surface of the carrier 11 far away from the carrying surface, and the marginal areas of both side surfaces of the carrier 11, respectively, and the present invention is however not limited thereto. In practical applications, the encapsulation structural member 13 may encapsulate the carrier 11, the LED chips 12 and the assembling parts 201 of the metal electrode plates (20a, 20b) entirely with the coverage area of 360° radius angle in the plane vertical to the extension direction of the metal electrode plates (20a, 20b), as shown in FIG. 2A. Further, to prevent the fluorescent powder within the encapsulation structural member 13 from emitting light of different colors as excited by different intensities of light emitted from different luminous surfaces of the LED chip 12, the encapsulating position of the encapsulation structural member 13 (i.e., the positions where the LED chips 12 and the carrier 11 are arranged) may be defined as follow: positioning the LED chips 12 and the carrier 11 at ½ eccentric position of the encapsulation structural member 13, i.e., positioning the top luminous surfaces of the LED chips 12 at central position of encapsulation structural member 13, as shown in FIG. 2B. Obviously, when color of light to be emitted is changed, the encapsulating position of encapsulation structural member 13 thereof may be finely adjusted according to actual needs, and it will not be specifically limited herein. Further, shape of section, in the direction vertical to the extension direction of the metal electrode plates (20a, 20b), of the encapsulation structural member 13 may be circular, square, ellipse, rhombus, or the like, as long as the encapsulation structural member 13 can encapsulate the carrier 11, the LED chips 12 and the assembling parts 201 of the metal electrode plates (20a, 20b) entirely with the coverage area of 360° radius angle in the plane vertical to the extension direction of the metal electrode plates (20a, 20b).

Also, it should be noted that, in this embodiment, only one row of LED chips 12 is arranged on the carrier 11, but the present invention is not limited thereto. In practical applications, the width of the carrier may be larger, and a plurality rows of the LED chips may be provided on the carrier, the arrangement mode of each row of the LED chips is similar to that in the above embodiment, and electrical connection among rows of LED chips may be realized by electrically connecting to the corresponding conductors by way of eutectic bonding, and then the LED chips provided at both ends of the carrier are connected to the metal electrode plates (20a, 20b) through conductors, so as to realize electrical connection to the external. In practical applications, the length and width of the carrier in the LED light-emitting device are not limited, and the number of rows of the LED chips on the carrier is also not limited.

Second Embodiment

Figure 3A:
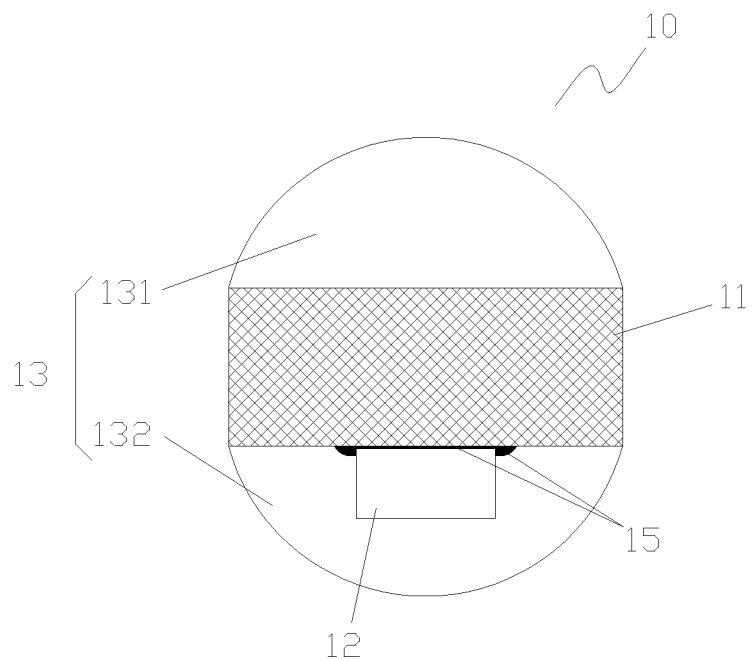
FIG. 3A is a front view of a LED light-emitting device provided by a second embodiment of the present invention.
Figure 3B:
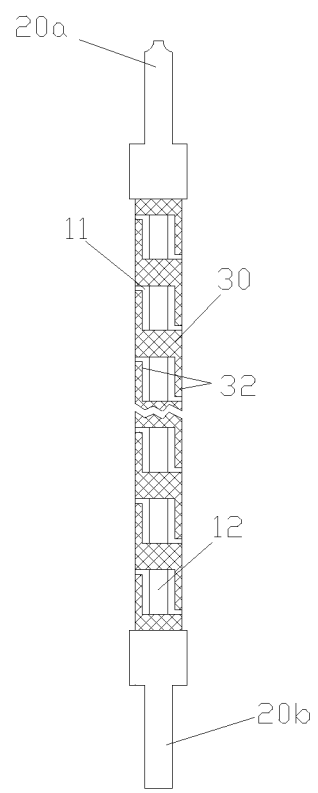
FIG. 3B is a top view of the LED light-emitting device provided by the second embodiment of the present invention.

As shown in FIGS. 3A and 3B, the structure of a LED light-emitting device provided by the second embodiment of the present invention is shown. Similar to the first embodiment, the LED light-emitting device 10 provided by the second embodiment includes a carrier 11, a plurality of LED chips 12, a pair of metal electrode plates (20a, 20b) and an encapsulation structural member 13, which is used for encapsulating the carrier 11, the plurality of LED chips 12 and the pair of metal electrode plates (20a, 20b).

The material of the carrier 11, the formation mode and appearance of the roughened reflecting layer 28 provided on its surface, the electrical connection modes among the plurality of the LED chips 12 and between the LED chips 12 and the metal electrode plates (20a, 20b), and the shape of section of the encapsulation structural member 13 and the like are similar to those in the first embodiment, and will not be repeated here.

Parts of the second embodiment that are different from those in the first embodiment will be described below in detail.

In the second embodiment, two protrusions 32 extending to each other are formed on two successively spaced conductors 30, and the two protrusions 32 are located at both sides of the LED chip 12 between two successively spaced conductors 30, as shown in FIG. 3B. With the protrusions 32, part of the light emitted from the LED chip 12 can be prevented from being directly output from marginal areas of both side surfaces of the carrier 11, but can be reflected after being blocked by the protrusions 32, so as to be output in other directions, so that color deviation of the LED light-emitting device, which occurs at the marginal areas of both side surfaces of the carrier 11, can be prevented, thereby ensuring that the LED light-emitting device 10 can output homogeneous light in respective directions. Preferably, lengths of the two protrusions 30 between the two successively spaced conductors 30 may be as longer as possible on the premise of not being in contact with the corresponding conductors 30, so as to block, to the greatest extent, light emitted, by the LED chips 12, output from the marginal areas of both side surfaces of the carrier 11. Further, when the LED chips 12 are LED chips of blue light or mixture of blue light and red light, the heat dissipation layer 15 should be made of a mixture of transparent glue and fluorescent powder, so as to ensure that light emitted, by the LED chips 12, output from the marginal areas of both side surfaces of the carrier 11 is white light, thereby ensuring that the LED light-emitting device 10 can output homogeneous white light in respective directions.

In this embodiment, in the section vertical to the extension direction of the metal electrode plates (20a, 20b), the encapsulation structural member 13 encapsulates, with an encapsulating angle of 180° radius angle and in circumferential direction, the carrying surface of the carrier 11, the LED chips 12 fixed thereon, and the surface of the carrier 11 far away from the carrying surface, respectively, i.e., the encapsulation structural member 13 consists of two portions, sections of which have a shape of semi-circle. The first portion 131 is used for encapsulating the surface of the carrier 11 far away from the carrying surface; and the second portion 132 is used for encapsulating the carrying surface of the carrier 11 and the LED chips 12 fixed thereon. It can be known that the difference between the encapsulation structural member 13 of this embodiment and that of the first embodiment lies in that not only the central areas of both side surfaces of the carrier 11 are exposed to the outside of the encapsulation structural member 13, but also the marginal areas of both side surfaces of the carrier 11 are exposed to the outside of the encapsulation structural member 13, i.e., both side surfaces of the carrier 11 are fully exposed to the outside of the encapsulation structural member 13. Further, as the above described protrusions 32 can prevent part of the light emitted from the LED chips 12 from being output directly from marginal areas of both side surfaces of the carrier 11, heat dissipation efficiency of the LED chips 12 can be further improved while it is ensured that the LED light-emitting device 10 can output homogeneous light in respective directions. Moreover, as the encapsulation structural member 13 is only required to encapsulate the carrying surface of the carrier, the LED chips 12 fixed thereon, and the surface of the carrier 11 far away from the carrying surface, this simplifies the structure of the encapsulation structural member 13 to a certain extent, so that the manufacturing process of the encapsulation structural member 13 can be simplified, thereby reducing the manufacturing cost of the LED light-emitting device 10 to a certain extent.

It can be understood that, in practical applications, whether the heat dissipation layer, the encapsulation structural member and/or the carrier contain fluorescent powder can be determined according to actual needs. In addition, in the present application, the heat dissipation layer, the encapsulation structural member and/or the carrier being transparent means that light emitted from the LED chips can transmit through the heat dissipation layer, the encapsulation structural member and/or the carrier.

It can also be understood that, the foregoing implementations are merely exemplary implementations for the purpose of explaining the principle of the present invention, but the present invention is not limited thereto. For those skilled in the art, various modifications and improvements can be made without departing from the spirit and essence of the present invention, and, these modifications and improvements also fall within the protection scope of the present invention.

What is claimed is:

1. A LED light-emitting device, comprising:
    a carrier, which is a transparent body, and conductors are provided on a carrying surface of the carrier;
    a plurality of LED chips, the number of the LED chips is N, the number of the conductors is N+1, where N is an integer larger than 1, and the N LED chips and the N+1 conductors are alternately arranged along an extension direction of a pair of electrodes;

chip soldering pads are provided at both ends of a bonding surface of each LED chip, circuit soldering pads are correspondingly provided at two ends of two conductors adjacent to the LED chip, and shape of the chip soldering pads corresponds to that of the circuit soldering pads;

each LED chip and two conductors adjacent thereto are electrically connected by soldering the chip soldering pads with the circuit soldering pads by way of eutectic bonding, so as to realize electrical connection among the plurality of LED chips;

an encapsulation structural member, which is a transparent body and encapsulates the carrying surface of the carrier, the LED chips fixed on the carrying surface of the carrier, a surface of the carrier far away from the carrying surface of the carrier, and marginal areas of both side surfaces of the carrier; or two protrusions extending to each other are formed on two successively spaced conductors, and the two protrusions are located at both sides of the LED chip between the two successively spaced conductors, and in a section vertical to the extension direction of the pair of electrodes, the encapsulation structural member encapsulates, with an encapsulating angle of 180° radius angle and in circumferential direction, the carrying surface of the carrier, the LED chips fixed on the carrying surface of the carrier, and a surface of the carrier far away from the carrying surface of the carrier, respectively, so that both side surfaces of the carrier are exposed to the outside of the encapsulation structural member; and a pair of electrodes, wherein positive/negative electrodes of the pair of electrodes are electrically connected, by means of the conductors, to the LED chips located at the most upstream/most downstream of a current transmission in the plurality of LED chips, and extend to the outside of the encapsulation structural member.

2. The LED light-emitting device according to claim 1, wherein the pair of electrodes is a pair of metal electrode plates, each of the metal electrode plates includes an assembling part and a connecting part, which are integrally connected to each other, wherein the assembling parts are bonded to both ends of the carrying surface of the carrier by means of conductive adhesive, and the adhesive is electrically connected to the corresponding conductor by way of eutectic bonding, reflow soldering or high temperature solidification; and ends of the connecting parts of the pair of metal electrode plates, which are far away from the assembling parts, have different shapes.

3. The LED light-emitting device according to claim 2, wherein limit grooves are formed at both ends of the carrier and positioned on the carrying surface of the carrier, the assembling parts are fixed into the limit grooves by means of the adhesive, and the adhesive encapsulates outer surfaces of the assembling parts inside the limit grooves; or limit grooves are provided at ends of the assembling parts far away from the connecting parts, both ends of the carrier are fixed into the limit grooves by means of the adhesive, and the adhesive encapsulates outer surfaces of the carrier inside the limit grooves.

4. The LED light-emitting device according to claim 2, wherein the width of the assembling part is larger than that of the connecting part.

5. The LED light-emitting device according to claim 1, wherein a heat dissipation layer that is transparent and heat-conductive is provided between the carrying surface of the carrier and the bonding surfaces of the LED chips for exchanging heat with the LED chips, and material of the heat dissipation layer includes one or more of silica gel, epoxy glue, and silicon resin.

6. The LED light-emitting device according to claim 1, wherein the conductor is made of a conductive metal material.

* * * * *